United States Patent [19]

Fox et al.

[11] 4,420,123

[45] Dec. 13, 1983

[54] FORCE RATE SENSOR ASSEMBLY

[75] Inventors: David S. Fox; Donald G. Cawelti, both of Tucson, Ariz.

[73] Assignee: The United States of America as represented by the Secretary of the Army, Washington, D.C.

[21] Appl. No.: 312,202

[22] Filed: Oct. 19, 1981

[51] Int. Cl.³ .............................................. B65H 59/10
[52] U.S. Cl. .................... 242/147 R; 242/45; 226/45; 310/323; 310/328; 310/348
[58] Field of Search .......... 242/147 R, 155 R, 155 M, 242/45, 75.5, 75.51, 75.2, 75.3; 226/11, 45; 310/311, 318, 319, 323, 328, 338, 348

[56] References Cited

U.S. PATENT DOCUMENTS

| | | | |
|---|---|---|---|
| 1,886,815 | 11/1932 | Hund | 310/323 X |
| 2,586,037 | 2/1952 | Heffelfinger | 242/155 M X |
| 3,361,314 | 1/1968 | Gith | 226/11 |
| 3,613,065 | 10/1971 | Lindemann et al. | 226/45 X |
| 3,732,446 | 5/1973 | Bryant | 310/348 X |
| 3,903,733 | 9/1975 | Murayama et al. | 310/328 X |

Primary Examiner—Stanley N. Gilreath
Attorney, Agent, or Firm—Robert P. Gibson; Jeremiah G. Murray; Michael C. Sachs

[57] ABSTRACT

A force rate sensor for providing a signal proportional to the time rate of change of an applied force.

1 Claim, 2 Drawing Figures

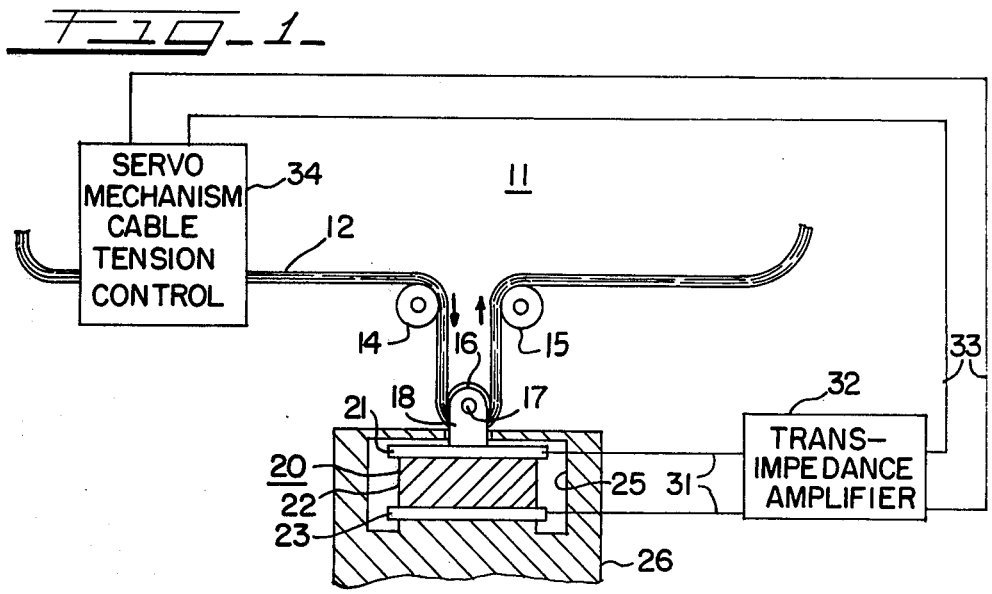
FIG_1
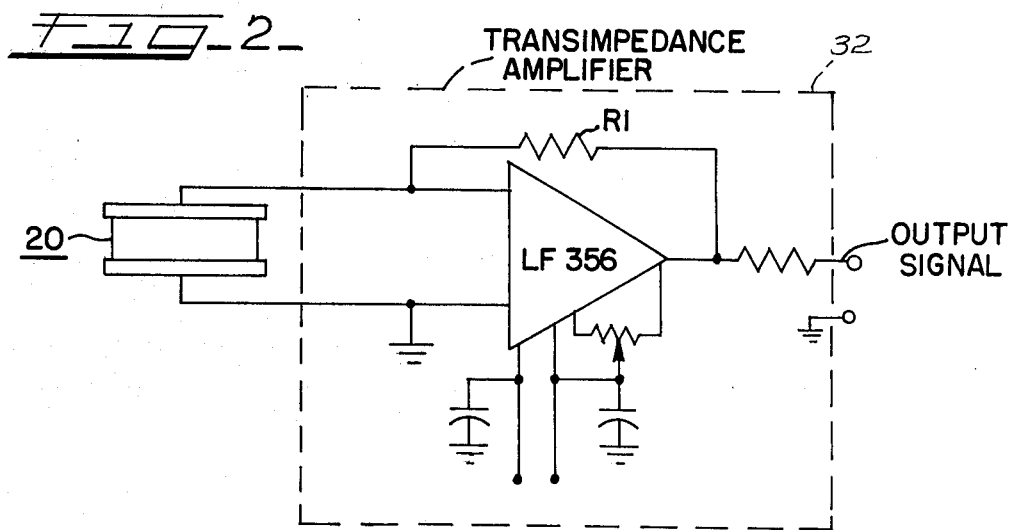
FIG_2

FORCE RATE SENSOR ASSEMBLY

The Government has rights in this invention pursuant to Contract No. DAAB07-78-C-2964, awarded by the Department of the Army.

BACKGROUND OF INVENTION

Methods and apparatus for stabilizing servo mechanisms, such as for controlling the tension of a fiber optic cable during winding, are known in the art.

SUMMARY OF INVENTION

The invention comprises an apparatus and method for sensing the time rate of change of tension on a cable being wound and providing a control signal proportional thereto. A use of the present invention is in a machine for winding fiber optic bobbins, and, more particularly, to stabilize the servo mechanism which controls the fiber optic cable tension during winding.

DESCRIPTION OF DRAWINGS

The foregoing features and advantages of the present invention will be apparent from the following more particular description of the invention. The accompanying drawings, listed hereinbelow, are useful in explaining the invention wherein:

FIG. 1 is an illustrative diagram, showing the structural concept of the present apparatus; and FIG. 2 is a diagram to show one embodiment of the piezoelectric crystal and the transimpedance amplifier.

DESCRIPTION OF THE INVENTION

Refer to FIG. 1, which shows the force rate sensor system 11 for monitoring the tension on a moving fiber optic cable 12 which is being wound on a bobbin of conventional design (not shown).

FIG. 1 depicts the cable 12, shown as being movable in the direction of the arrows, carried around two idler pulleys 14 and 15 and engaging a tension pulley 16. Pulley 16 is rotatably attached, via a pivot member 17 and a non-conductive plate 18, such as of suitable plastic, to the piezoelectric transducer 20. Piezoelectric transducer 20 comprises a piezoelectric crystal 22, bonded between two spaced conductive plates 21 and 23. The piezoelectric transducer 20 may be of any suitable type known in the art.

The piezoelectric transducer 20 is positioned in a chamber 25, formed in a non-conductive mounting frame 26. It should be appreciated that the proper packaging of the crystal is important. Because very high impedances are involved, surface leakage currents have to be held to a minimum. Also, the piezoelectric crystal 22 and the mounting of the crystal 22 are configured to minimize the sensitivity of the transducer 20 to vibrations.

The output from the piezoelectric transducer 20 is coupled from plates 21 and 23 through leads 31 to a transimpedance amplifier 32. As will also be explained further, amplifier 32 provides an electrical signal proportional to the time rate of change of tension on cable 12, and couples this electrical signal through leads 33 to a servo mechanism cable tension control 34, of any suitable known type, to control the tension or applied force on cable 12.

The concept involved in the operation of the force-rate sensor is believed to be as follows. As stated above, the force-rate sensor or "jerk" sensor of the invention provides an output signal proportional to the rate of change of an applied force. The system provides a signal which is proportional to the rate of change of the tension in the cable 12, which signal is used as a rate feedback signal to the servo.

The sensor consists of a piezoelectric crystal transducer 20 and the transimpedance amplifier 32, as shown in FIG. 1. The piezoelectric crystal 22 can be thought of as a fixed value capacitor, with a stored charge which is proportional to the mechanical strain to which the crystal is being subjected. An infinite impedance volt meter, connected across the piezoelectric crystal, will indicate a voltage (v) which is proportional to the mechanical strain $\epsilon$, $$V = k_1 \epsilon \qquad (1)$$

where $k_1$ is the constant of proportionality. Since the voltage across a capacitor is $$V = q/c \qquad (2)$$

where q is the stored charge and c is the capacity, we have $$q = k_1 c \epsilon = k_2 \epsilon \qquad (3)$$

The value of $k_2$ is approximately proportional to the volume of the piezoelectric crystal.

The output of the piezoelectric crystal 22 is connected to the input of transimpedance amplifier 32. Amplifier 32 provides an output voltage which is proportional to the input current. The amplifier circuit consists of a high-gain voltage amplifier 32, in which an inverse feedback voltage is coupled to the input terminal through a resistor R1 feedback. One embodiment of the amplifier 32 is shown in FIG. 2, and comprises an operational amplifier LF 356 manufactured by Motorola.

Since the current into a device is equal to the time derivative of the input charge, $$i = dq/dt, \qquad (4)$$

the output signal from the amplifier is $$E_0 = k_3 i = k_3(dq/dt) = k_2 k_3 (d\epsilon/dt) \qquad (5)$$

where $k_3$ is transfer gain of the amplifier and $d\epsilon/dt$ is the rate of change of the crystal strain.

By Hooke's law, the mechanical strain in a member is proportional to the applied stress, which is again proportional to the applied force. Hence, $$\epsilon = k_4 F_1 \qquad (6)$$

and $$d\epsilon/dt = k_4(dF/dt) \qquad (7)$$

where F is the applied force. Combining equations 5 and 7, and setting $k_2 k_3 k_4 = K$, we have $$E_0 = K(dF/dt) \qquad (8)$$

For a crystal of given size and characteristics, the magnitude of the output signal can be varied by changing the value of the feedback resistor $R_1$. The greater the value of the resistance, the greater is the magnitude of the output signal for a given force input function. There is a limit, however, to the value of the resistance since increasing the resistance also increases the magnitude of the noise output and drift of the operational amplifier.

While the invention has been particularly shown and described with reference to a preferred embodiment thereof, it will be understood by those skilled in the art that various changes in form and details may be made therein without departing from the spirit and scope of the invention.

We claim:

1. A mechanism to control tension in a fiber optic cable during winding of the cable onto bobbins comprising:

at least two idler pulleys and a tension sensing pulley through which the cable is carried, whereby tension is applied to the tension pulley by the cable;

means connected to said tension pulley for measuring tension in said tension pulley comprising a plate of electrically non-conductive material carrying said tension pulley and which experiences a pull which is proportional to the tension in the cable, a piezoelectric transducer having crystal means bonded to upper and lower electrically conductive plates, said upper electrically conductive plate fixedly mounting said electrically non-conductive plate, a fixed frame of electrically non-conductive material bonded to said lower electrically conductive plate, and output leads connected to each of said electrically conductive plates for generating an electrical signal proportional to the force straining on said crystal means applied by said tension pulley and cable; the crystal means, plates and frame being configured to minimize the sensitivity of the crystal means to vibrations;

means for enhancing said electrical signal comprising a transimpedance operational amplifier means with inverse feedback, the input to which comprises a current from said electrical signal and the output of which comprises a voltage proportional to said input current, representing over time, the rate of change of the instantaneous applied force to the crystal means; and a servo mechanism cable tension control means for varying tension, within selected limits, on the cable being wound, said servo mechanism cable tension control being actuated by a signal comprised of the output signal of said means for enhancing.

* * * * *